United States Patent
Boutami et al.

(10) Patent No.: US 10,937,643 B2
(45) Date of Patent: Mar. 2, 2021

(54) INFRARED DEVICE

(71) Applicant: COMMISSARIAT A L'ENERGIE ATOMIQUE ET AUX ENERGIES ALTERNATIVES, Paris (FR)

(72) Inventors: Salim Boutami, Grenoble (FR); Emerick Lorent, Crolles (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/633,804

(22) PCT Filed: Jul. 25, 2018

(86) PCT No.: PCT/FR2018/051903
§ 371 (c)(1),
(2) Date: Jan. 24, 2020

(87) PCT Pub. No.: WO2019/020937
PCT Pub. Date: Jan. 31, 2019

(65) Prior Publication Data
US 2020/0234942 A1 Jul. 23, 2020

(30) Foreign Application Priority Data

Jul. 27, 2017 (FR) ..................................... 17 57149

(51) Int. Cl.
*H01K 1/32* (2006.01)
*G01J 3/10* (2006.01)
(Continued)

(52) U.S. Cl.
CPC .............. *H01K 1/325* (2013.01); *G01J 3/108* (2013.01); *G01N 21/3504* (2013.01); *H01K 1/08* (2013.01);
(Continued)

(58) Field of Classification Search
None
See application file for complete search history.

(56) References Cited

U.S. PATENT DOCUMENTS 4,558,660 A * 12/1985 Nishizawa ............ C30B 25/105
118/50.1
5,220,173 A * 6/1993 Kanstad .................. G01J 3/108
250/493.1
(Continued)

FOREIGN PATENT DOCUMENTS

DE 20 2015 002 315 U1 5/2015
JP 2005-140594 A 6/2005
(Continued)

OTHER PUBLICATIONS

International Search Report dated Nov. 2, 2018 in PCT/FR2018/051903 filed on Jul. 25, 2018, 3 pages.
(Continued)

*Primary Examiner* — Ashok Patel
(74) *Attorney, Agent, or Firm* — Oblon, McClelland, Maier & Neustadt, L.L.P.

(57) ABSTRACT

The invention relates to an infrared device comprising a resistive element suspended in a cavity formed in a main element, and capable of transmitting infrared radiation when it is fed with an electric current. In particular, the main element is at least partly covered on the outer surface thereof and/or the inner surface thereof with a reflective coating. The use of the reflective coating makes it possible to at least partly contain infrared radiation transmitted by the resistive element in the cavity.

20 Claims, 6 Drawing Sheets

(51) Int. Cl.
    *G01N 21/3504*    (2014.01)
    *H01K 1/08*       (2006.01)
    *H01K 1/10*       (2006.01)
    *H01K 3/26*       (2006.01)
    *H05B 3/00*       (2006.01)

(52) U.S. Cl.
    CPC .............. *H01K 1/10* (2013.01); *H01K 3/26* (2013.01); *H05B 3/0033* (2013.01); *G01N 2201/06186* (2013.01)

(56) References Cited

U.S. PATENT DOCUMENTS

| | | | | |
|---|---|---|---|---|
| 5,324,951 | A * | 6/1994 | Kocache | G01J 3/108 250/493.1 |
| 6,367,972 | B1 * | 4/2002 | Kamiyama | G01J 5/06 327/512 |
| 2008/0272389 | A1 | 11/2008 | Rogne et al. | |
| 2010/0097048 | A1 * | 4/2010 | Werner | H01Q 15/0046 324/76.11 |
| 2010/0213500 | A1 | 8/2010 | Rogne et al. | |
| 2016/0282259 | A1 | 9/2016 | Kolb et al. | |
| 2018/0039024 | A1 | 2/2018 | Boutami | |
| 2019/0011261 | A1 | 1/2019 | Taurel | |
| 2019/0018197 | A1 | 1/2019 | Boutami | |
| 2019/0113446 | A1 | 4/2019 | Boutami | |
| 2019/0195779 | A1 | 6/2019 | Boutami | |
| 2019/0196109 | A1 | 6/2019 | Hassan | |
| 2019/0212493 | A1 | 7/2019 | Hassan | |
| 2019/0243064 | A1 | 8/2019 | Menezo | |
| 2019/0265407 | A1 | 8/2019 | Boutami | |

FOREIGN PATENT DOCUMENTS

| | | |
|---|---|---|
| WO | WO 90/14580 A1 | 11/1990 |
| WO | WO 92/05411 A1 | 4/1992 |
| WO | WO 95/08755 A1 | 3/1995 |
| WO | WO 2006/031125 A1 | 3/2006 |
| WO | WO 2013/167874 A1 | 11/2013 |

OTHER PUBLICATIONS

French Preliminary Search Report dated Jan. 9, 2018 in French Application 1757149 filed on Jul. 27, 2017.

Barritault et al., "Mid-IR source based on a free-standing microhotplate for autonomous $CO_2$ sensing in indoor applications," Elsevier, Sensors and Actuators A, vol. 172, 2011, pp. 379-385, doi:10.1016/j.sna.2011.09.027.

* cited by examiner

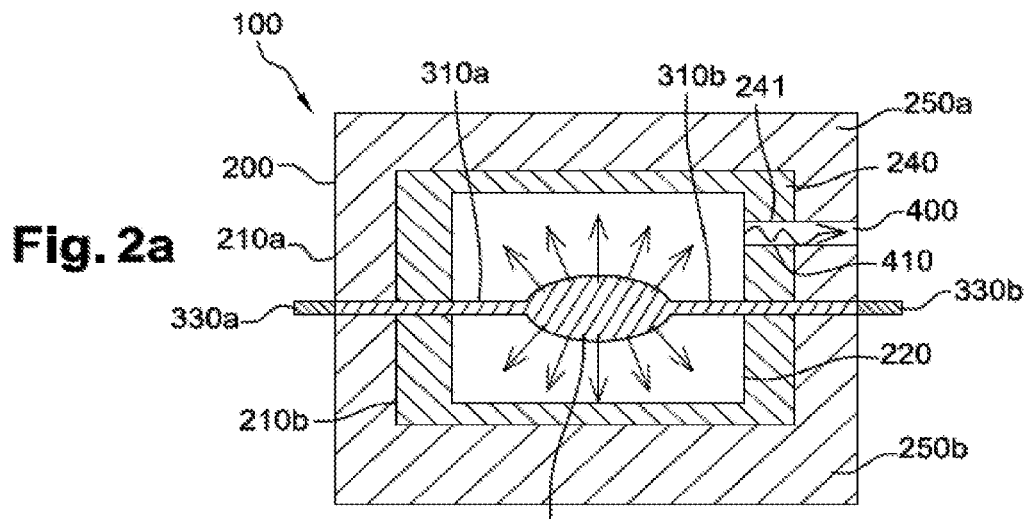
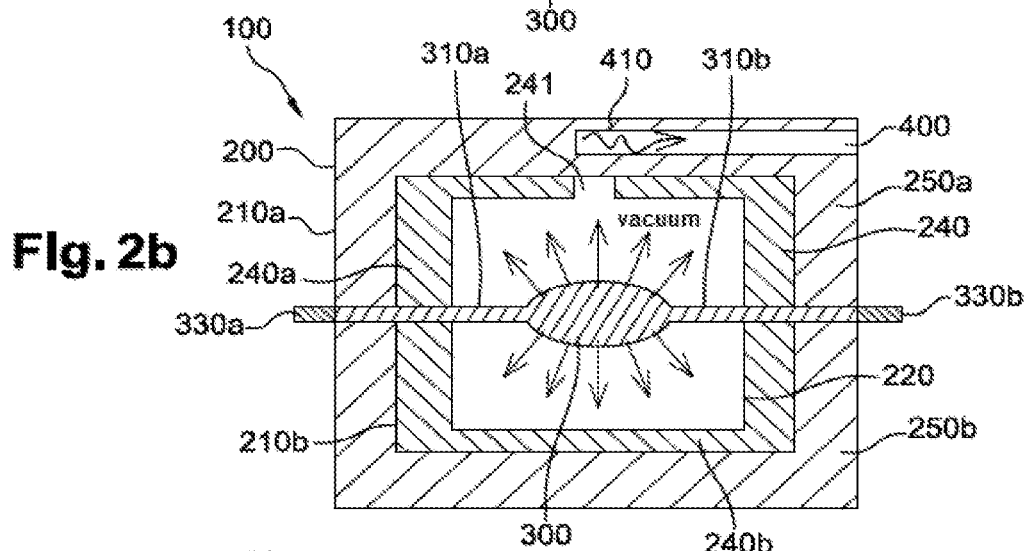
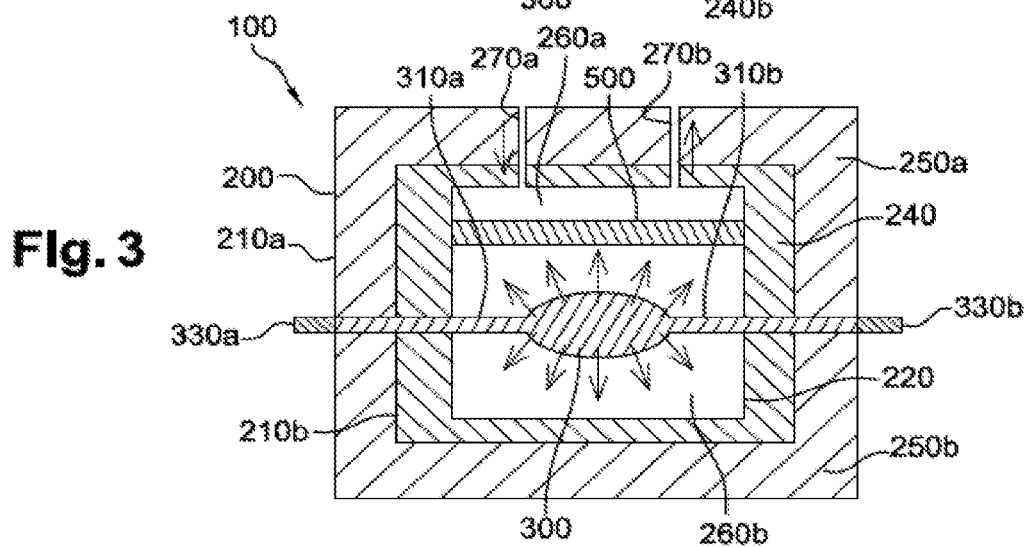

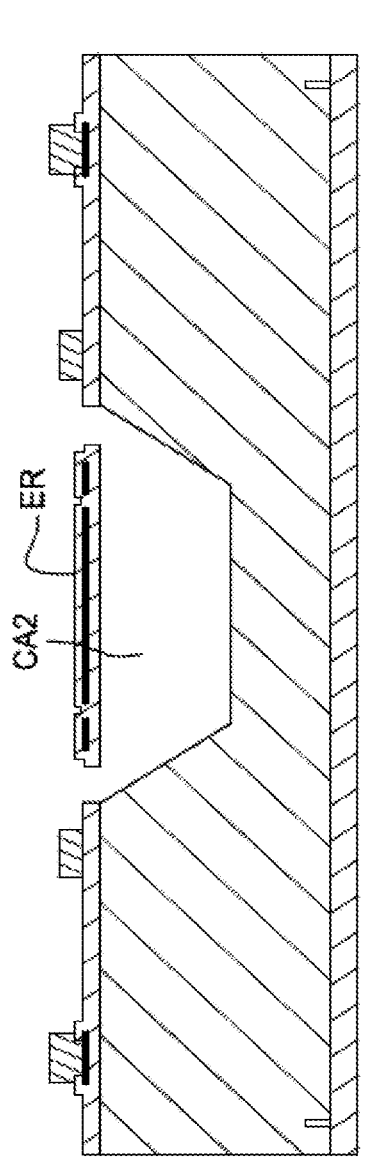
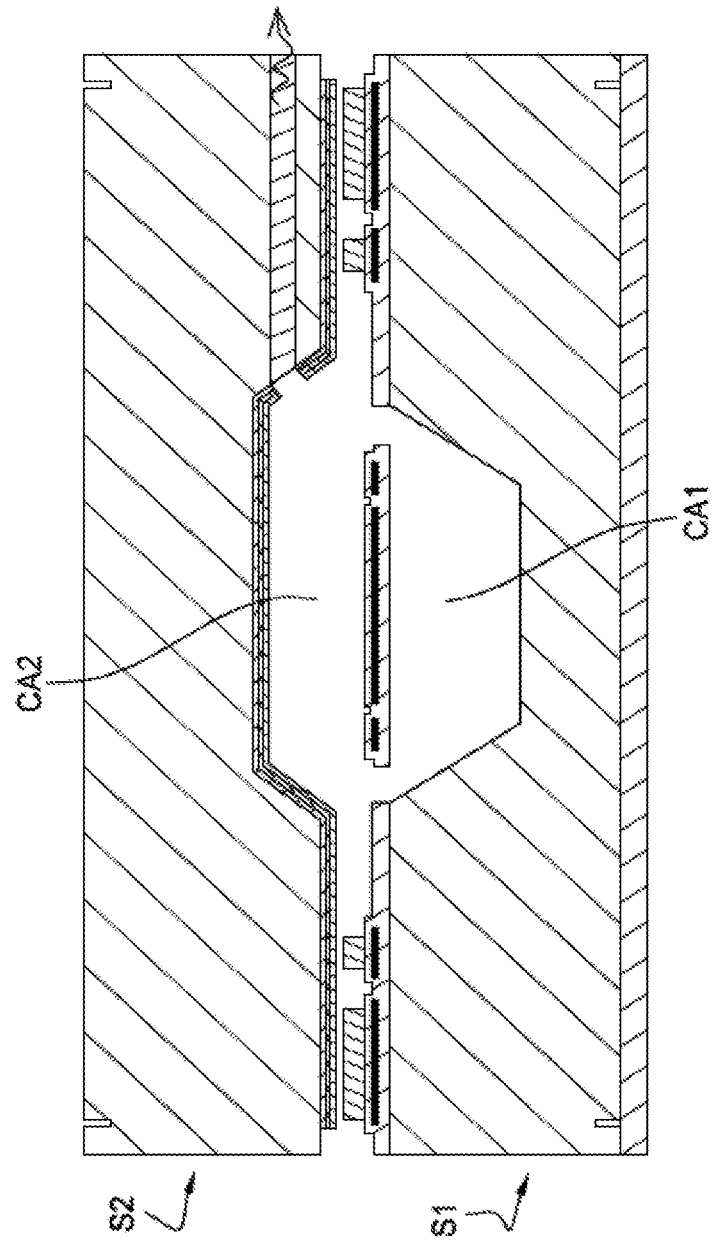

INFRARED DEVICE

TECHNICAL FIELD

The present invention relates to an infrared device provided with an infrared source. In particular, the present invention relates to an infrared device for detecting gas.

PRIOR ART

Non-dispersive infrared ("NDIR") sources are known in the state of the art, and are commonly implemented in gas detectors.

By way of example, FIG. 1 illustrates an infrared micro-source known in the state of the art and described by Barritault et al. [1]. In particular, the infrared micro-source comprises a metal filament formed on a membrane suspended by two suspension arms.

The metal filament, when an electric current flows therethrough, heats and emits an infrared radiation according to the black body law.

In other words, the intensity of the infrared radiation increases with the temperature at which the metal filament is heated.

This operating temperature of the infrared source however remains limited, and cannot exceed the degradation temperature of the constituent elements of the infrared source, de facto restraining the intensity of the infrared radiation likely to be emitted by said source.

The efficiency of the infrared source is also limited by air conduction losses which can occur when the latter is operating. In this regard, it has been suggested to hold the infrared source under vacuum, or at least, in a reduced pressure atmosphere, for example at a pressure lower than $10^{-2}$ mbar, in order to reduce heat conduction losses.

However, such an arrangement is still not satisfactory.

Indeed, the radiation emitted by the infrared source remains highly dispersed, such that only a relevant fraction of said radiation is efficiently used for gas detection.

Moreover, since a significant light intensity is required, it can be necessary to implement an infrared source the area of which is higher.

One purpose of the present invention is thereby to provide an infrared device, comprising an infrared source, and having a better efficiency than devices known in the state of the art.

Another purpose of the present invention is to provide an infrared device likely to be implemented for gas detection without resorting to an optical detector.

Another purpose of the present invention is to provide an arrangement of an infrared source in the infrared device enabling the design of a gas detector the sensitivity of which is improved with respect to gas detectors known in the state of the art.

Another purpose of the present invention is to provide an infrared device coupled with a waveguide. In particular, one purpose of the present invention is to provide an infrared device the major part of the emitted infrared radiation of which is coupled with the waveguide.

DISCLOSURE OF THE INVENTION

The purposes of the invention are, at least partly, achieved by an infrared device for generating an infrared radiation, said device comprising:

a main element comprising an external surface and an internal surface, the internal surface defining a cavity;

at least one resistive element for emitting an infrared radiation when a current flows therethrough, said at least one resistive element being held in suspension, by at least two suspension arms, in the cavity, said suspension arms being arranged to make an electrical contact between the resistive element and two connection terminals disposed outside the cavity, the external surface and/or the internal surface are, at least partly, coated with a reflective coating, said reflective coating having a reflectivity coefficient of at least 90%, preferentially at least 95%, further preferentially at least 99%, in the range of infrared wavelengths likely to be emitted by the at least one resistive element, the reflective coating being also arranged such that the infrared radiation emitted by the resistive element and reflected by said coating is, at least partly, absorbed by the resistive element.

According to one implementation, the at least one resistive element is in an environment held at a pressure lower than $10^{-2}$ mbar, preferentially between $10^{-3}$ mbar and $10^{-2}$ mbar.

According to one implementation, the main element comprises two sub-elements respectively called a first sub-element and a second sub-element, arranged so as to form the cavity, and each defining a first sub-volume and a second sub-volume of said cavity, both sub-elements being connected to each other by a hermetic connection. According to one implementation, both suspension arms are held at the hermetic connection, and extend towards the resistive element.

According to one implementation, a waveguide is coupled, along a first end of said waveguide, to the cavity at a through opening formed on the reflective coating, and such that an infrared radiation diffusing at the through opening out of the cavity is, at least partly, guided by said waveguide, said reflective coating being arranged such that only the infrared radiation likely to be emitted by the resistive element and passing through the through opening diffuses out of the cavity.

According to one implementation, the first end of the waveguide is flush with the internal surface and in correspondence with the through opening.

According to one implementation, the first end of the waveguide is at a predetermined distance from the internal surface, the predetermined distance being advantageously lower than a wavelength of the infrared radiation likely to be emitted by the resistive element, and for being guided by said waveguide.

According to one embodiment, the first sub-element is made of a material transparent to infrared radiation.

According to one embodiment, the reflective coating comprises a first coating part covering the internal surface (210b) at the first sub-element.

According to one implementation, the waveguide extends, from the first end, along a direction essentially perpendicular to the normal direction defined by the section of internal surface in correspondence with the through opening.

According to one implementation, the reflective coating comprises a second coating part covering either of the internal and external surfaces at the second sub-element.

According to one implementation, the waveguide is included in the main element.

According to one implementation, said infrared device further comprises a membrane transparent to infrared radiation likely to be emitted by the resistive element, said membrane hermetically separating the volume of the cavity into two volume sections called a first volume section and a second volume section respectively, the main element comprises at least one, advantageously two, openings opening at the first volume section and which are for ensuring a gas or liquid flow in said first volume section, the resistive element is disposed in the second volume section.

According to one implementation, the infrared device further comprises means for detecting a temperature change of the resistive element.

According to one implementation, the main element includes both connection terminals.

According to one implementation, the resistive element comprises a metal filament, advantageously, the metal filament is interposed between two dielectric layers, further advantageously, the stack comprising the metal filament interposed between both dielectric layers is disposed on a mechanical support.

According to one implementation, the first sub-element and the second sub-element comprise a semiconductor material, the semiconductor material being advantageously silicon.

According to one implementation, the hermetic connection between the first sub-element and the second sub-element is a metal-metal bonding, or a eutectic weld, advantageously the eutectic weld is made with silicon and gold, or Au and In, or Cu and Sn, or Au and Sn, or Au and Ge, or Al and Ge.

According to one implementation, the resistive element is provided with a filter adapted to select a spectral range of the infrared radiation likely to be emitted by said resistive element.

According to one embodiment, the main element is partly made of a material transparent to infrared radiation.

The invention also relates to the use of the infrared device for detecting and identifying gas and/or liquid.

BRIEF DESCRIPTION OF THE DRAWINGS

Further characteristics and advantages will appear in the detailed following description of embodiments of the infrared device, given by way of non-limiting examples, in reference to the appended drawings in which:

FIG. 2a is a schematic representation in a cutting plane of the infrared device according to a first alternative of a first embodiment of the invention, FIG. 2b is a schematic representation in a cutting plane of the infrared device according to a second alternative of the first embodiment of the invention, FIG. 3 is a schematic representation in a cutting plane of the infrared device according to a second embodiment of the invention, FIGS. 6a-6f are schematic representations of steps of a method for manufacturing the infrared device according to the first alternative of the first embodiment of the invention.

DETAILED DISCLOSURE OF PARTICULAR EMBODIMENTS

Figure 1:
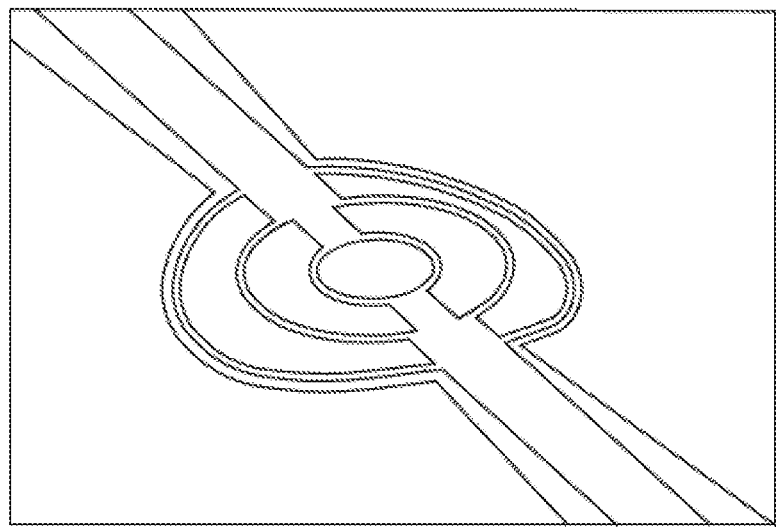
FIG. 1 is a schematic representation of a resistive element known in the state of the art.

The invention described in further detail below implements an infrared device comprising a resistive element in suspension in a cavity formed in a main element, and likely to emit an infrared radiation when an electric current flows therethrough. In particular, the main element is at least partly covered, on its outer surface and/or its inner surface, with a reflective coating. The implementation of the reflective coating enables an infrared radiation emitted by the resistive element in the cavity to be at least partly confined.

In FIGS. 2a, 2b, 3, and 4, exemplary implementations of the infrared device 100 according to the invention can be seen.

The infrared device 100 comprises a main element 200.

The main element 200 comprises an external surface 210a (or external wall) and an internal surface 210b (or internal wall). In particular, the internal surface 210b delimits the volume of a cavity 220.

By "internal surface", it is meant a surface which is not exposed to the external environment. In other words, the cavity delimited by the internal surface is, at least partly, closed.

By "external surface", it is meant a surface which, since it is coated with no coating, is exposed to the external environment (in other words, the environment external to the cavity).

It is thus understood without needing to specify it, that the main element 200 forms an at least partially closed enclosure.

The space between the external surface 210a and the internal surface 210b defines the thickness of the main element 200.

The main element 200 can be made of a material transparent to infrared radiation.

By "transparent to infrared radiation", it is meant an element allowing infrared transmissivity of at least 50%.

The main element 200 can comprise at least one of the materials selected from: silicon, germanium, silicon germanium alloy, AlGaS, GaS, InP. The infrared device 100 also comprises a resistive element 300.

By "resistive element", it is meant an element which, when an electric current flows therethrough, heats and emits an infrared radiation. In other words, the resistive element 300 is an electrically resistive element.

By "infrared radiation", it is meant a light radiation in a wavelength range between 3 µm and 12 µm.

The resistive element 300 is held in suspension in the cavity 220 by two suspension arms 310a and 310b.

Figure 4:
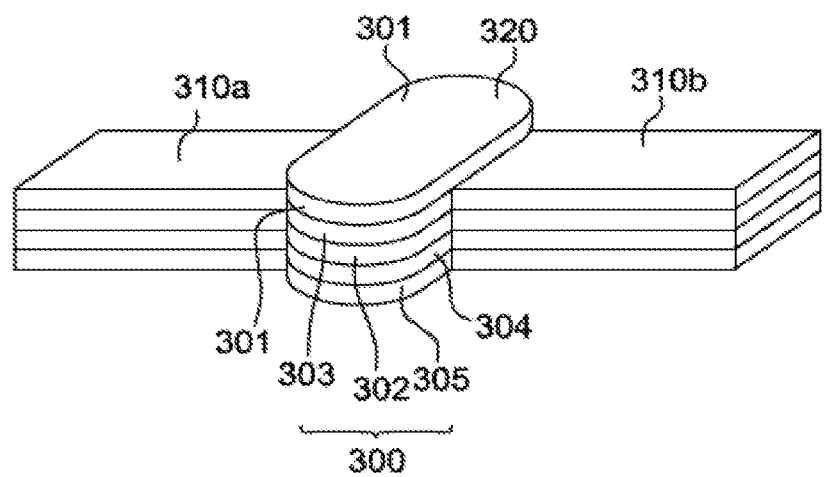
FIG. 4 is a perspective representation of a resistive element likely to be implemented in the present invention.

By way of example, the resistive element 300 can include at least one structured part of a stack of layers 301 (FIG. 4). In particular, the stack of layers can comprise a metal filament 302, for example interposed between two dielectric layers 303, 304 made of a dielectric material. The metal filament 302 can in particular comprise platinum.

The dielectric layers 302, 304 can comprise titanium nitride.

The resistive element 300 can also comprise a mechanical support 305 on which the stack of layers 301 rests. The mechanical support 305 is for example made of silicon, or silicon nitride.

The resistive element 300 can be in the form of a circular pellet. However, the invention should not be limited to this form.

Both suspension arms 310a and 310b extend from the resistive element 300, and are anchored to the main element 200.

The structure of the suspension arms 310a and 310b is similar to that of the resistive element 300.

Advantageously, the resistive element 300 is in an environment held at a pressure lower than $10^{-2}$ mbar, preferentially between $10^{-3}$ mbar and $10^{-2}$ mbar.

Details on the implementation and dimension of a resistive element 300 for the purposes of the present invention are given in document [1] listed at the end of the description. The invention is however not limited to the resistive element as described in document [1].

The resistive element 300 is also electrically connected to connection terminals 330a and 330b from which an electric current can be imposed to said resistive element 300.

The connection terminals 330a and 330b are disposed outside the cavity 220. It is thus understood, without needing to specify it, that the electric connection between the resistive element 300 and both connection terminals 330a and 330b is made via the suspension arms 310a and 310b.

The infrared device for the purposes of the present invention further comprises a reflective coating 240. In particular, the reflective coating 240 can cover, at least partly, the external surface 210a and/or the internal surface 210b.

Moreover, the reflective coating 240 has a reflectivity coefficient of at least 90%, preferentially at least 95%, further preferentially at least 99%, in the range of infrared wavelengths likely to be emitted by the resistive element 300.

The reflective coating 240 can comprise a metal species, for example gold, and/or silver, and/or aluminium.

The reflective coating 240 can, for example, exclusively cover the external surface 210a or the internal surface 210b.

The main element 200 can comprise two sub-elements called a first sub-element 250a and a second sub-element 250b, respectively.

Both sub-elements 250a and 250b are arranged so as to form the cavity. Each sub-element 250a and 250b forms a hollow element and comprises a rim. The assembly of both sub-elements 250a and 250b, by affixing the rim of the first one against the rim of the other one, forms the cavity 220.

Both sub-elements 250a and 250b, when assembled, are advantageously connected by a hermetic connection.

The hermetic connection can advantageously be a eutectic weld.

For example, the eutectic weld can be made with silicon and gold, or Au and In, or Cu and Sn, or Au and Sn, or Au and Ge, or Al and Ge.

The hermetic connection can be a metal-metal bonding.

Moreover, both suspension arms 310a and 310b can be held at the hermetic connection, and extend towards the resistive element 300.

In particular, both suspension arms 310a and 310b can pass through the main element from inside to outside the cavity.

The reflective coating 240 can cover, at the first sub-element, the external surface 210a or the internal surface 210b.

Equally, the reflective coating 240 can cover, at the second sub-element 250b, the external surface 210a or the internal surface 210b.

According to a first embodiment, the infrared device can comprise a waveguide 400.

By "waveguide", it is meant a channel adapted to guide a light radiation in the extension direction of said channel.

Moreover, according to this embodiment, the reflective coating 240 comprises a through opening 241, and is arranged such that only the infrared radiation, likely to be emitted by the resistive element 300, and passing through the through opening 241 diffuses out of the cavity 220.

The waveguide 400, for the purposes of the present invention, is thereby coupled along its first end 410 to the cavity 220 at the through opening 241, such that an infrared radiation diffusing out of the cavity is at least partly guided by the waveguide.

It is clear, without needing to specify it, that the waveguide is disposed out of the cavity.

Advantageously, the waveguide can comprise a core made of an SiGe alloy.

According to a first alternative of the first embodiment illustrated in FIG. 2a, the first end 410 of the waveguide 400 is flush with the internal surface and in correspondence with the through opening.

In particular, the waveguide 400 can open into the cavity 220 at the first sub-element 250a. Still according to this first alternative, the reflective coating 240 can cover the internal surface 210b at the first sub-element 250a, and cover either the internal surface 210b or the external surface 210a at the second sub-element 250b.

According to a second alternative of the first embodiment illustrated in FIG. 2b, the first end 410 of the waveguide 400 is at a predetermined distance from the internal surface 210b. In other words, the waveguide 400 does not open into the cavity at the internal surface 210b. It is also clear that since there is an optical coupling between the cavity and the waveguide at its first end, the latter is necessarily in proximity to the through opening. The predetermined distance is advantageously lower than a wavelength of the infrared radiation likely to be emitted by the resistive element 300, and for being guided by said waveguide 400.

In particular, the waveguide 400 can extend, from the first end, along a direction essentially perpendicular to the normal direction defined by the section of internal surface 210b in correspondence with the through opening.

By "section of internal surface 210b in correspondence with the through opening", it is meant a surface section of internal surface circumscribed by the contour of the through opening.

Additionally, by "normal to a section of surface", it is meant a direction perpendicular to said surface, where necessary, perpendicular to a mean plane defined by said section of surface.

For example, the reflective coating 240 comprises a first coating part 240a which covers, at the first sub-element 250a, the internal surface 210a. The through opening 241 is moreover disposed at the first coating part 240a. The first end 410 of the waveguide 400 is further disposed at a predetermined distance from the through opening.

Moreover, it is clear, without needing to specify it, that since the waveguide is optically coupled to the cavity at its first end, a section of the waveguide extending from said first end is necessarily facing the through opening.

By "facing the through opening", it is meant a section of the waveguide at which the optical coupling is actual.

Advantageously, the reflective coating 240 comprises a second coating part 240b covering either of the internal and external surfaces at the second sub-element (in particular in FIG. 2b, the second coating part is disposed on the internal surface at the second sub-element).

Still advantageously, the waveguide 400 is included in the main element such that the material making up the main element 200 forms a sheath about the waveguide 400.

Moreover, the core of the waveguide can comprise a silicon germanium alloy.

In operation, in such an infrared device 100 according to either of the first and second alternatives, the infrared radiation emitted by the resistive element 300 is mostly coupled to the waveguide 400.

Indeed, the infrared radiation emitted by the resistive element 300 undergoes multiple reflections, which are either reabsorbed by said resistive element 300, or coupled to the waveguide 400.

The radiation reabsorbed by the resistive element 300 warms up said resistive element, and can thus be reemitted as an infrared radiation. This is called infrared radiation recycling. This recycling thereby enables the radiation rate coupled with the waveguide to be increased with respect to an equivalent device, but without a reflective coating. The implementation of the reflective coating and of a waveguide according to the present invention enables a guided NDIR source to be created.

In particular, the reflective coating enables the light power to be intensified along a particular direction (i.e.: the direction defined by the waveguide).

Finally, the waveguide 400 can be a single mode waveguide as well as a multimode waveguide.

The dimensioning of the waveguide is left to the judgement and general knowledge of those skilled in the art.

The infrared device according to this first embodiment enables co-integration of said device on a silicon chip with other devices, for example a gas chamber, a detector to be contemplated.

It can also be contemplated to integrate on said chip, demultiplexing components, and thus to separate the infrared flow guided by the waveguide into different spectral bands, in particular for identifying gases of different natures. The infrared device according to this embodiment enables a gas sensor also without an optical filter to be considered.

The inventors were able to perform optical simulations according to the first alternative of the first embodiment. These optical simulations were conducted considering two different cavity dimensionings for the infrared device.

In each case, the resistive element considered emits an infrared radiation at a length of 4.2 µm, the internal surface of the main element is covered with a gold layer. The waveguide opens into the internal surface, and is 3 µm height (single mode waveguide).

The two cavity dimensionings are, respectively, 100 µm×100 µm (first dimensioning), and 200 µm×200 µm (second dimensioning).

The infrared radiation coupling rate is 85% and 60%, respectively, for the first cavity dimensioning and the second cavity dimensioning. Thus, as previously specified, the radiation emitted by the resistive element undergoes a plurality of reflections in the cavity, until it is either reabsorbed by the resistive element (thereby, it will be reemitted because it warms up the resistive element), or coupled to the waveguide, or absorbed by the reflective coating.

According to a second embodiment (FIG. 3), the infrared device comprises a membrane 500 transparent to the infrared radiation likely to be emitted by the resistive element 300. In particular, the transparent membrane 500 hermetically separates the volume of the cavity into two volume sections called a first volume section 260a and a second volume section 260b respectively.

The transparent membrane 500 is for example made of silicon, but can comprise any other material transparent to infrared radiation.

Additionally, the main element 200 comprises two openings 270a and 270b opening at the first volume section and for enabling a gas or liquid flow in said first volume section.

The resistive element 300 is disposed in the second volume section. Particularly advantageously, the atmosphere in the second volume section is held at a pressure lower than $10^2$ mbar, preferentially between $10^3$ mbar and $10^2$ mbar.

The infrared device 100 can also comprise means for detecting a temperature change of the resistive element 300.

In operation, this device enables a liquid or a gas to be detected and identified.

Indeed, the infrared radiation emitted by the resistive element 300 undergoes multiple reflections, which are either reabsorbed by said resistive element 300, or absorbed by the gas or liquid (hereinafter "gas") flowing in the first volume section 260a.

The absorption by the gas thereby limits heating the resistive element 300 by re-absorbing the reflected or "multi-reflected" infrared radiation.

The implementation of the reflective coating for the purposes of the present invention enables multiple reflections for the infrared radiation to be considered, and thus the probability of absorbing said infrared radiation by the gas to be increased. The temperature variations thus observed at the resistive element 300 are thereby intensified, such that the infrared device according to the second embodiment can make up a gas detector with an improved sensitivity with respect to the same detector without a reflective coating.

In particular, the temperature variations of the resistive element 300 can be detected via the measurement of the current flowing (for example with an amperemeter) in said resistive element as a function of the electric voltage imposed thereto.

The gas can thus be detected by an abrupt cooling of the resistive element 300.

By way of example, the inventors have determined by numerical simulation the reflective coating effect on the sensitivity of a gas detector according to the second embodiment.

As part of the simulation, the inventors took into account:
the wavelength, $\lambda=4.2$ µm, of the infrared radiation emitted by the resistive element,
the absorption coefficient $\alpha$ of the gas, this coefficient is related to a gas absorption imaginary value k by the relationship:

$$\frac{I}{I_0} = e^{-\frac{4\pi}{\lambda} \cdot k \cdot L} = e^{-\alpha \cdot C \cdot L}$$

Figure 5:
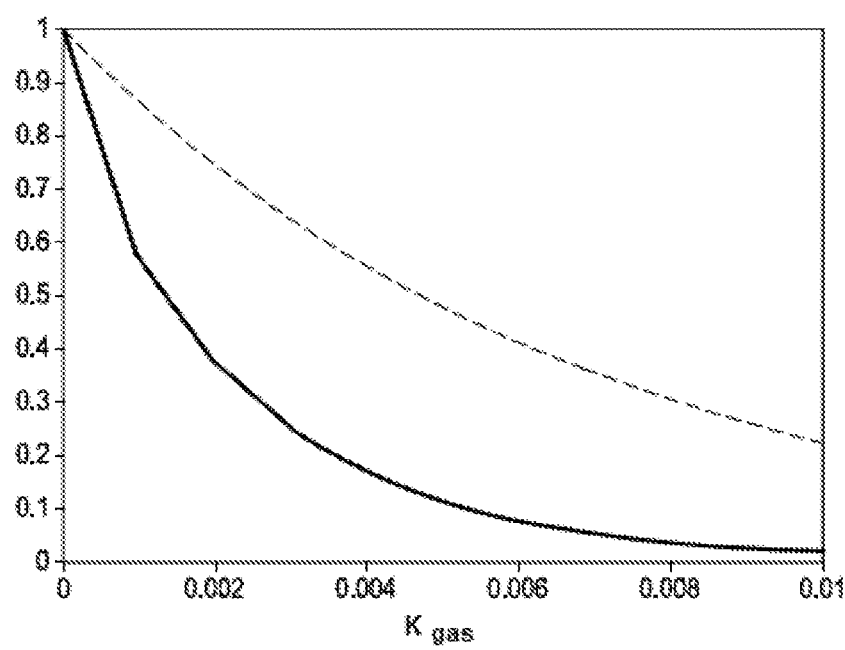
FIG. 5 is a graphic representation of infrared radiation attenuation (vertical axis) as a function of the gas absorption imaginary value, k, the dotted line curve represents the attenuation in an infrared device without of reflective coating, whereas the solid line curve considers the presence of a reflective coating.

FIG. 5 is a graphic representation resulting from the simulation. The dotted line curve represents the infrared radiation attenuation as a function of the absorption imaginary value k of the gas in the absence of a reflective coating, whereas the solid line curve considers the presence of a reflective coating. It is noted that the infrared radiation attenuation is much higher in the presence of the reflective coating. In other words, a gas detector based on this second embodiment has its sensitivity intensified by the implementation of the reflective coating.

According to the principle previously described, the gas detector is also without an optical detector.

Additionally, to be sensitive to a specific gas, the infrared radiation emitted by the resistive element 300 can be filtered.

In this regard, the resistive element can be provided with a filter 320 (FIG. 4) adapted to select a spectral range to which the gas of interest is sensitive. For example, the filter 320 can be a metal-insulator-metal (MIM) resonator directly placed on the resistive element 300.

Within the scope of the second embodiment, the implementation of a filter 320 also enables the sensitivity of the detector with respect to the specific gas to be improved (in other words, its detection threshold). Indeed, the limitation of the emission spectrum of the resistive element limits the radiation amount reabsorbed by said resistive element. As a result, since the specific gas at least partly absorbs the infrared radiation emitted by the resistive element, a more significant temperature drop of said resistive element occurs.

The production of the infrared device according to either of both embodiments involves micro-fabrication techniques known to those skilled in the art.

However, it is proposed in the following section of this disclosure to describe the main lines thereof, and in particular within the scope of the first embodiment of the present invention and in connection with FIGS. 6a to 6f.

Figure 6A:
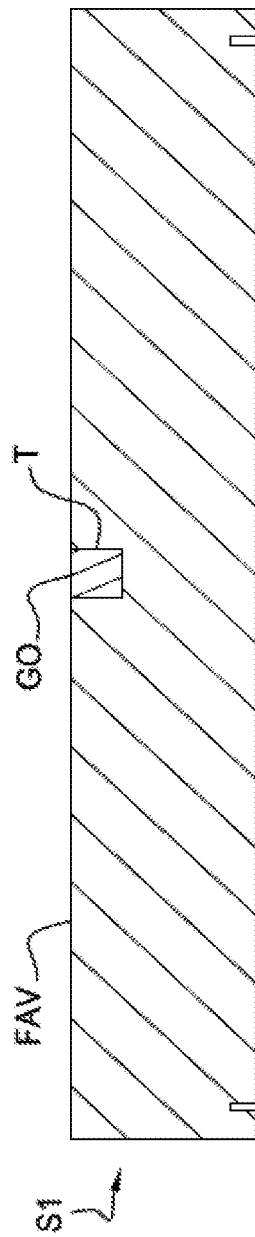

A first step of the production method consists in providing a first substrate S1, for example a silicon substrate, which comprises two faces called a front face FAV and a rear face FAR respectively (FIG. 6a).

A trench T, for accommodating the waveguide GO is then formed (by dry or liquid etching) on the front face FAV of the substrate S. The trench T is then filled with a material for forming the core of the waveguide GO, for example SiGe.

Figure 6B:

An encapsulation layer CE is formed on the front face FAV of the substrate S so as to encapsulate the waveguide. The encapsulation layer CE can be a silicon layer formed by an epitaxy step (FIG. 6b).

Figure 6C:
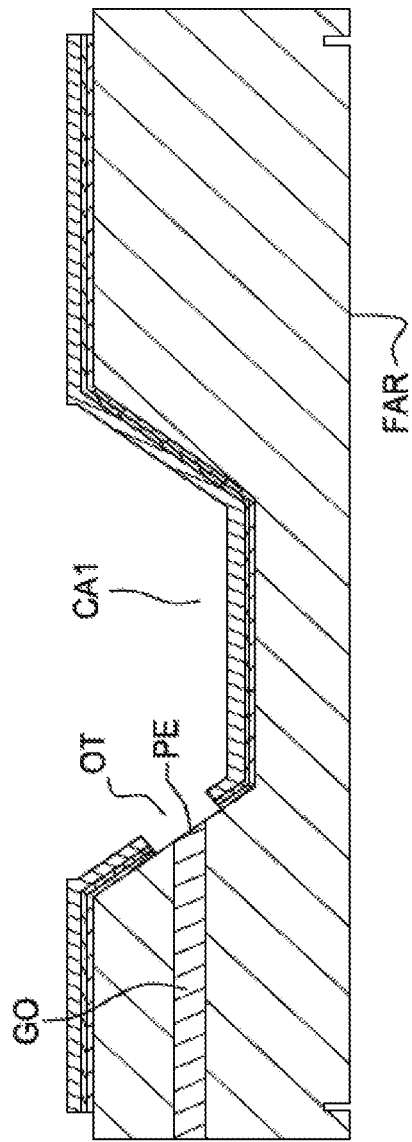
Figure 6F:
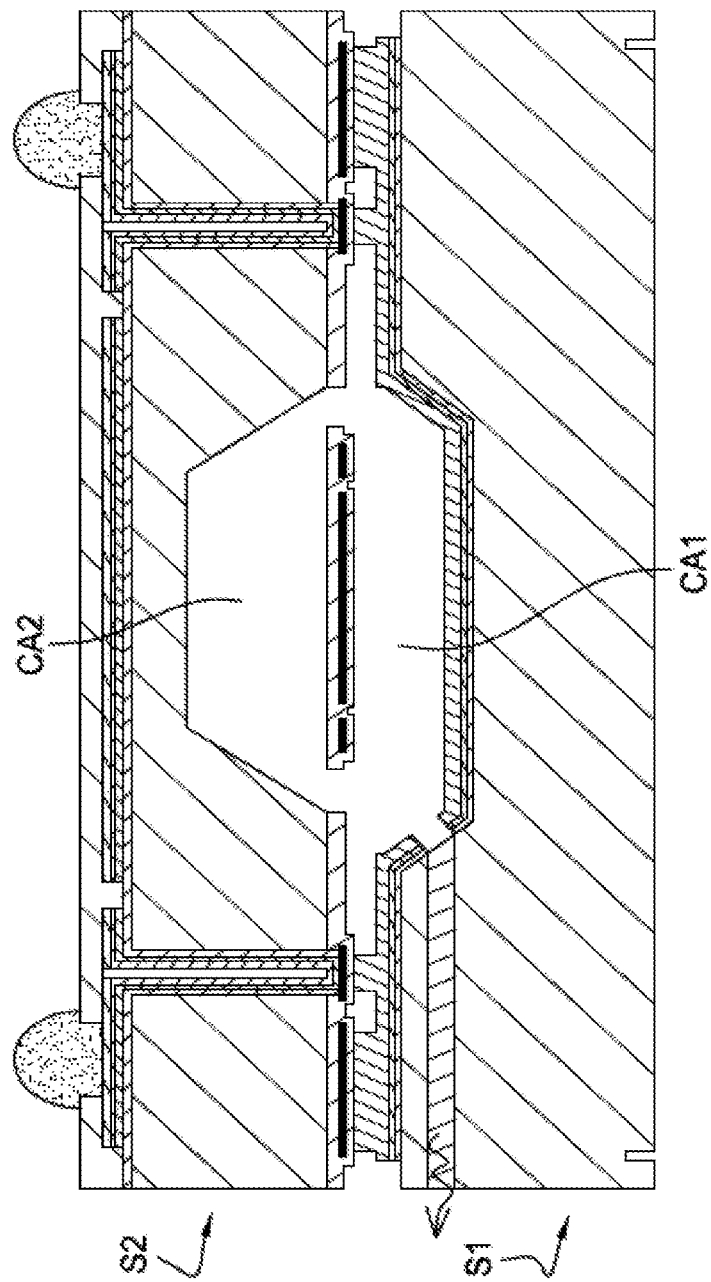

The formation of the encapsulation layer CE is then followed by a step of forming a first cavity CA1 (FIG. 6c). In particular, the step of forming the cavity comprises an etching (for example liquid etching) step performed such that the waveguide GO opens, along a first end PE, into said cavity. The cavity formation step comprises steps of masking, and/or aligning photolithographic masks which are part of the general knowledge of those skilled in the art and which are thus not explained in the present disclosure.

The walls of the cavity are then covered with a reflective coating provided with a through opening OT at the first end PE of the waveguide GO.

The reflective coating can be a gold layer. Additionally, the formation of the gold layer on the walls of the first cavity CA1 can be preceded by the deposit of diffusion barriers comprising for example a stack of a titanium layer and a silicon oxide layer.

The production method also comprises a step of forming a resistive element ER on a second substrate S2 (FIG. 6d). The resistive element ER is suspended by two suspension arms BS1 and BS2 above a second cavity CA2.

The steps of the method for producing the resistive element ER are part of the state of the art, and in this regard, those skilled in the art can refer to document [1] listed at the end of the description (in particular section "3. Device fabrication", which is an integral part of the present description).

A metallisation bead CM comprising chromium, nickel and gold can be formed about the cavity. This metallisation bead CM is for example for ensuring an hermetic assembly, by metal-metal bonding or by eutectic bonding for example, between the first cavity CA1 and the second cavity CA2 (FIG. 6e).

A step of thinning the second substrate S2, at the end of the assembly of both cavities CA1 and CA2, can be performed.

A trench TA, defining the second sub-element previously described, is then carried out. This trench TA can be formed by "RIE" ("Reactive Ion Etching"), and is followed by a step of forming the reflective coating on the outer surface of the second sub-element 250b.

A method for producing the infrared device according to the second embodiment is essentially transposable from the production steps previously shown.

REFERENCES

[1] P. Barritault et al., "Mid-IR source based on a free-standing microhotplate for autonomous $CO_2$ sensing in indoor-applications", Sensors and Actuators A, 172, p. 379-385, (2011)

The invention claimed is:

1. An infrared device for generating an infrared radiation, comprising:
   a main element comprising an external surface and an internal surface, the internal surface defining a cavity;
   at least one resistive element for emitting an infrared radiation when a current flows therethrough, said at least one resistive element being held in suspension, by at least two suspension arms, in the cavity, said suspension arms being arranged to make an electrical connection between the resistive element and two connection terminals disposed outside the cavity and said suspension arms being anchored to the main element,
   wherein at least one of the external surface and the internal surface are, at least partly, coated with a reflective coating, said reflective coating having a reflectivity coefficient of at least 90% in a range of infrared wavelengths likely to be emitted by the at least one resistive element, the reflective coating being also arranged such that the infrared radiation emitted by the resistive element and reflected by said coating is, at least partly, absorbed by the resistive element.

2. The infrared device according to claim 1, wherein the at least one resistive element is in an environment held at a pressure lower than $10^{-2}$ mbar.

3. The infrared device according to claim 1, wherein the main element comprises two sub-elements respectively called a first sub-element and a second sub-element, arranged so as to form the cavity, and respectively defining a first sub-volume and a second sub-volume of said cavity, both sub-elements being connected to each other by a hermetic connection.

4. The infrared device according to claim 3, wherein both suspension arms are held at the hermetic connection, and extend towards the resistive element.

5. The infrared device according to claim 1, wherein a waveguide is coupled, along a first end of said waveguide, to the cavity at a through opening formed through the reflective coating, and such that an infrared radiation diffusing at the through opening out of the cavity is, at least partly, guided by said waveguide to a second end of said waveguide, said reflective coating being arranged such that only infrared radiation emitted by the resistive element and passing through the through opening likely diffuses out of the cavity.

6. The infrared device according to claim 5, wherein the first end of the waveguide is flush with the internal surface and in correspondence with the through opening.

7. The infrared device according to claim 5, wherein the first end of the waveguide is at a predetermined distance from the internal surface, the predetermined distance being lower than a wavelength of the infrared radiation likely to be emitted by the resistive element, and for being guided by said waveguide.

8. The infrared device according to claim 7, wherein the waveguide extends, from the first end, along a direction essentially perpendicular to the normal direction defined by the section of internal surface in correspondence with the through opening.

9. The infrared device according to claim 7, wherein the main element comprises two sub-elements respectively called a first sub-element and a second sub-element, arranged so as form the cavity, and respectively defining a first sub-volume and a second sub-volume of said cavity, both sub-elements being connected to each other by a hermetic connection, and wherein the first sub-element is made of a material transparent to infrared radiation.

10. The infrared device according to claim 9, wherein the reflective coating comprises a first coating part covering the internal surface at the first sub-element.

11. The infrared device according to claim 7, wherein the main element comprises two sub-elements respectively called a first sub-element and a second sub-element, arranged so as to form the cavity, and respectively defining a first sub-volume and a second sub-volume of said cavity, both sub-elements being connected to each other by a hermetic connection, and wherein the reflective coating comprises a second coating part covering either of the internal and external surfaces at the second sub-element.

12. The infrared device according to claim 5, wherein the waveguide is included in the main element.

13. The infrared device according to claim 1, wherein said infrared device further comprises a membrane transparent to infrared radiation likely to be emitted by the resistive element, said membrane hermetically separating the volume of the cavity into two volume sections called a first volume section and a second volume section respectively, the main element comprises at least one opening which opens at the first volume section and which are for ensuring a gas or liquid flow in said first volume section, the resistive element is disposed in the second volume section.

14. The infrared device according to claim 13, wherein the infrared device further comprises means for detecting a temperature change of the resistive element.

15. The infrared device according to claim 1, wherein the main element includes the two connection terminals.

16. The infrared device according to claim 1, wherein the resistive element comprises a metal filament.

17. The infrared device according to claim 1, wherein the main element comprises two sub-elements respectively called a first sub-element and a second sub-element, arranged so as to form the cavity, and respectively defining a first sub-volume and a second sub-volume of said cavity, both sub-elements being connected to each other by a hermetic connection and wherein the first sub-element and the second sub-element comprise a semiconductor material.

18. The infrared device according to claim 17, wherein the hermetic connection between the first sub-element and the second sub-element is a metal-metal bonding or a eutectic weld.

19. The infrared device according to claim 1, wherein the resistive element is provided with a filter adapted to select a spectral range of the infrared radiation likely to be emitted by said resistive element.

20. The infrared device according to claim 1, wherein the main element is partly made of a material transparent to infrared radiation.

* * * * *